(12) United States Patent
Bales et al.

(10) Patent No.: US 11,349,491 B2
(45) Date of Patent: May 31, 2022

(54) TIME-INTERLEAVED SAMPLING CIRCUITS WITH RANDOMIZED SKIPPING

(71) Applicant: Omni Design Technologies Inc., Milpitas, CA (US)

(72) Inventors: James Edward Bales, Fort Collins, CO (US); Denis Clarke Daly, Wellesley, MA (US); Vikas Singh, Newark, CA (US)

(73) Assignee: Omni Design Technologies, Inc., Milpitas, CA (US)

( * ) Notice: Subject to any disclaimer, the term of this patent is extended or adjusted under 35 U.S.C. 154(b) by 0 days.

(21) Appl. No.: 17/192,588

(22) Filed: Mar. 4, 2021

(65) Prior Publication Data

US 2021/0281271 A1  Sep. 9, 2021

Related U.S. Application Data

(60) Provisional application No. 62/984,871, filed on Mar. 4, 2020.

(51) Int. Cl.
*H03M 1/12* (2006.01)
*H03M 1/06* (2006.01)

(52) U.S. Cl.
CPC ......... *H03M 1/1215* (2013.01); *H03M 1/066* (2013.01); *H03M 1/128* (2013.01)

(58) Field of Classification Search
CPC ..... H03M 1/1215; H03M 1/128; H03M 1/066
USPC ........................................ 341/118, 120, 155
See application file for complete search history.

(56) References Cited

U.S. PATENT DOCUMENTS 9,294,112 B1 * 3/2016 Devarajan ........... H03M 1/0836
9,793,910 B1 * 10/2017 Devarajan ............. H03M 1/124

OTHER PUBLICATIONS

W. C. Black et al., "Time-interleaved converter arrays", IEEE J. Solid-State Circuits, Dec. 1980, pp. 1022-1029, vol. 15, No. 12, IEEE.
B. Razavi, "Design Considerations for Interleaved ADCs", IEEE J. Solid-State Circuits, Aug. 2013, pp. 1806-1817, vol. 48, No. 8, IEEE.
N. Kurosawa et al., "Explicit analysis of channel mismatch effects in time-interleaved ADC systems", IEEE Transactions on Circuits and Systems I: Fundamental Theory and Applications, Mar. 2001, pp. 261-271, vol. 48, No. 3, IEEE.
R. Jewett et al., "A 12b 128MSamplels ADC with 0.05LSB DNL," IEEE International Solid-State Circuits Conference Digest of Technical Papers, Feb. 1997, pp. 138-139, IEEE.
(Continued)

*Primary Examiner* — Khai M Nguyen
(74) *Attorney, Agent, or Firm* — Intrinsic Law Corp.

(57) ABSTRACT

A time-interleaved sampling system includes an input signal having a time-varying analog value and a plurality of samplers. Each sampler is operable in a hold mode and a track mode. In the track mode, the samplers track the analog value of the input signal. In the hold mode, each sampler holds a respective analog value of the input signal that a respective sampler tracked immediately before entering the hold mode. The samplers enter the track mode in a predetermined sequence. After a last sampler in the predetermined sequence enters the track mode, the predetermined sequence is repeated in a loop. At random intervals, a skipped sampler in the predetermined sequence is bypassed from entering the track mode.

24 Claims, 10 Drawing Sheets

(56) References Cited

OTHER PUBLICATIONS

K. Poulton et al., "A 20GS/a 8b ADC with a 1MB Memory in 0.18,urn CMOS", Dig. Tch. Papers, 2003, pp. 318-319, ISSCC.

J. Elbornsson et al., "Blind estimation of timing errors in interleaved AD converters", IEEE International Conference on Acoustics, Speech, and Signal Processing. Proceedings (Cat. No.01CH37221), 2001, pp. 3913-3916, vol. 6., Salt Lake City, UT, USA.

M. EL-Chammas et al., "A 12-GS/s 81-mW 5-bit Time-Interleaved Flash ADC With Background Timing Skew Calibration", J. Solid-State Circuits, Apr. 2011, pp. 838-847, vol. 46, No. 4, IEEE.

S. Devarajan et al., "A 12-b 10-GS/s Interleaved Pipeline ADC in 28-nm CMOS Technology", J. Solid-State Circuits, Dec. 2017, pp. 3204-3218, vol. 52, No. 12, IEEE.

S. Lee et al., "A 1GS/s 10b 18.9mW time-interleaved SAR ADC with background timing-skew calibration," International Solid-State Circuits Conference Digest of Technical Papers, Feb. 2014, pp. 384-385, IEEE.

M. Tamba et al., "A method to improve SFDR with random interleaved sampling method", Proceedings International Test Conference 2001 (Cat. No. 01CH37260), 2001, pp. 512-520, Baltimore, MD, USA.

J. Elbornsson et al., "Analysis of mismatch noise in randomly interleaved ADC system", International Conference on Acoustics, Speech, and Signal Processing, 2003. Proceedings. (ICASSP '03)., 2003, pp. VI-280, IEEE.

\* cited by examiner

| Sample No. /Clock cycle | Frame/Cycle No. | Skip | Available ADCs (at start of clock cycle) | ADC Entering Track Mode (at start of clock cycle) | Available ADCs (at end of clock cycle) |
|---|---|---|---|---|---|
| 0 | 0 | 0 | 0,7 | 0 | 1-7 |
| 1 | 0 | 0 | 1,7 | 1 | 2-7 |
| 2 | 0 | 0 | 2,7 | 2 | 3-7 |
| 3 | 0 | 0 | 3,7 | 3 | 4-7 |
| 4 | 0 | 0 | 4,7 | 4 | 5-7 |
| 5 | 0 | 0 | 5,7 | 5 | 6-7 |
| 6 | 0 | 0 | 6,7 | 6 | 7 |
| 7 | 0 | 0 | 0,7 | 7 | 0 |
| 8 | 1 | 1 | 0,1 | 0 | 1 |
| 9 | 1 | 0 | 1,2 | 2 | 1 |
| 10 | 1 | 0 | 1,3 | 3 | 1 |
| 11 | 1 | 0 | 1,4 | 4 | 1 |
| 12 | 1 | 0 | 1,5 | 5 | 1 |
| 13 | 1 | 0 | 1,6 | 6 | 1 |
| 14 | 1 | 0 | 1,7 | 7 | 1 |
| 15 | 2 | 0 | 0,1 | 0 | 2 |
| 16 | 2 | 0 | 1,2 | 1 | 2 |
| 17 | 2 | 0 | 2,3 | 2 | 3 |
| 18 | 2 | 0 | 3,4 | 3 | 4 |
| 19 | 2 | 0 | 4,5 | 4 | 5 |
| 20 | 2 | 0 | 5,6 | 5 | 6 |
| 21 | 2 | 1 | 6,7 | 7 | 6 |
| 22 | 2 | 0 | 0,6 | 0 | 6 |
| 23 | 2 | 0 | 1,6 | 1 | 6 |
| 24 | 3 | 0 | 2,6 | 2 | 6 |
| 25 | 3 | 0 | 3,6 | 3 | 6 |
| 26 | 3 | 0 | 4,6 | 4 | 6 |
| 27 | 3 | 0 | 5,6 | 5 | 6 |
| 28 | 3 | 0 | 6,7 | 6 | 7 |
| 29 | 3 | 0 | 0,7 | 7 | 0 |
| 30 | 3 | 1 | 0,1 | 1 | 0 |
| 31 | 3 | 0 | 0,2 | 2 | 0 |

TIME-INTERLEAVED SAMPLING CIRCUITS WITH RANDOMIZED SKIPPING

CROSS-REFERENCE TO RELATED APPLICATIONS

This application claims priority to U.S. Provisional Application No. 62/984,871, titled "Method for Randomizing Sampling Sequence of Time-Interleaved Sampling Circuits," filed on Mar. 4, 2020, which is hereby incorporated by reference.

TECHNICAL FIELD

This application relates generally to sampling circuits, such as time-interleaved sampling circuits.

BACKGROUND

Time-interleaved (TI) analog-to-digital converters (ADCs) are widely used in high-speed applications. The operation principle of a TI ADC 10 is illustrated in FIG. 1. An input signal is time-demultiplexed into N nominally identical ADCs (sub-ADCs), each sub ADC sampling at a sampling rate of $f_s$. The digital outputs from N sub-ADCs are multiplexed into a single digital output sequence. Assuming the sub-ADCs are perfectly matched and the input demultiplex timing is evenly spaced, the TI ADC has an effective sampling rate of $Nf_s$, N times higher than a single sub-ADC.

The main drawback of TI ADCs is that various mismatches, such as offset, gain, and timing mismatches between sub-ADCs produce undesirable effects, such as the sub-ADCs producing distortion in the digital representation of the sampled signal. For example, offset mismatches between sub-ADCs produce tones at $f_s$ and its integer multiple frequencies, where $f_s$ is the sampling rate of the sub-ADCs. Gain mismatches between sub-ADCs cause the input signal to be modulated by $f_s$ and its integer multiple frequencies, thereby creating aliases of the input signal that may fall within the signal band, corrupting the input signal. Although offset mismatches and gain mismatches degrade the signal-to-noise and distortion ratio (SNDR) and spurious-free dynamic range (SFDR), they can be calibrated or randomized using various prior art calibration methods. Sample timing skew (timing skew) is a deviation of the sampling instances from a perfectly-periodic sequence. In an ideal N-channel TI ADC, the interval between the two sampling instances is precisely $1/Nf_s$. In other words, the sample timing among the N channels is perfectly evenly-spaced. However, due to clock and signal routing as well as logic delay mismatches between sub-ADCs, the intervals may deviate from the ideal interval. This timing skew produces phase modulation effects of the input signal, and may produce unwanted interference in the signal frequency band.

Various prior art calibration methods have been proposed to reduce the effects of mismatches. Foreground calibration designates a specific calibration period, during which normal ADC operation is discontinued, the mismatches are measured, and their correction factors are computed. During subsequent normal ADC operation, the correction factors are used to compensate for the errors caused by the mismatches. The drawbacks of the foreground calibration methods are unavailability of the ADC during calibration, and the need for recalibration when the power supply voltage or the temperature changes.

Background calibration methods avoid these drawbacks by performing calibration while the ADC is in normal operation. However, the input signal must satisfy certain characteristics for the calibration to be effective. For example, autocorrelation-based background timing skew calibration methods require the input signal to be wide sense stationary (WSS) over the statistical averaging period, which is referred to as quasi-WSS. Furthermore, each of the N ADC output signals must have the same quasi-WSS properties. This is a condition that is referred to as modulo-N WSS. This requirement is fundamental to blind estimation of mismatch errors in TI ADCs without requiring special input signals for calibration. An example of an input signal that does not meet the quasi-WSS criteria for a 4-way (N=4) TI ADC is a sinusoidal signal at frequency $f_s$ or its integer multiple frequencies.

Alternative background calibration methods that utilize a full-speed reference ADC do not require the WSS properties. However, their ultimate aggregate sampling rate is limited by the reference ADC, and thus have limited applicability.

Another method for mitigating mismatch errors is to randomize the sampling sequence of the sub-ADCs in a TI ADC. Random sampling sequence methods randomize the structured errors produced by mismatches between sub-ADCs, and can improve the SFDR. However, the random sampling does not improve SNDR of the TI ADCs because the error energy is merely spread across the signal band. For this reason, random sampling is often employed in combination with either foreground or background calibration. Random sampling then further improves SFDR by broadening the residual spurs after calibration. In addition, random sampling facilitates the quasi modulo-N WSS condition even for the input signals that do not meet this condition for autocorrelation-based background calibration methods.

In certain cases, hierarchical time interleaving (HTI) architecture is employed, which comprises S time-interleaved sample-and-hold circuits (SHCs) and a total of M sub-ADCs, each SHC driving M/S time-interleaved sub ADCs. An example of an HTI ADC 20 is illustrated in FIG. 2. The aggregate sampling rate of the HTI ADC is $SMf_s$, where $f_s$ is the sampling rate of a sub-ADC. In HTI ADCs, timing skew between sub-ADCs is unimportant because the input to the sub ADCs is already sampled and held by the SHC. Therefore, only timing skew between SHCs is of importance, which can be mitigated by foreground or background calibration similar to those applied to non-hierarchical TI ADCs. Also, the random sampling sequence can be applied to the SHCs to improve the SFDR, and to satisfy the WSS properties.

When multiple time-interleaved sub-ADCs or SHCs, both of which are referred to as 'samplers' hereafter, are used, immediately after a sampling operation occurs, there will be some subset of the other samplers available for the next sampling operation. When the design is fully optimized for maximum speed with the minimum number of samplers, only one sampler is available, which means that the sampler sequencing must be cyclically sequential, and no randomization is possible. If there are more than the minimum number of samplers, two or more samplers are available for the next sampling operation, then the sampling sequence can be randomized, subject to the constraint of using available samplers.

Existing random sequencing methods require that all samplers are randomly selected. However, this adds a significant amount of complexity to include such a randomization circuit. It also adds complexity in the skew detection autocorrelation circuits for timing skew calibration as well as requires sampler digital output reordering due to the randomization.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a time-interleaved sampling system comprising an input signal having a time-varying analog value; and a plurality of samplers, each sampler operable in a track mode and a hold mode. In the track mode, the samplers track the analog value of the input signal. In the hold mode, each sampler holds a respective analog value of the input signal, the respective analog value comprising the analog value that a respective sampler tracked immediately before entering the hold mode. The samplers enter the track mode in a predetermined sequence. After each sampler is in the track mode for a predetermined time period, each sampler transitions to the hold mode. After a last sampler in the predetermined sequence enters the track mode, the predetermined sequence is repeated in a loop. At random intervals, a skipped sampler in the predetermined sequence is bypassed from entering the track and hold modes.

In one or more embodiments, the sampling system further comprises a random skip generation digital logic circuit having an output coupled to an input of the samplers. In one or more embodiments, the random skip generation digital logic circuit includes a pseudo-random number generator having a pseudo-random number output that corresponds to the skipped sampler. In one or more embodiments, the random skip generation digital logic circuit includes encoded sampler skipping rules.

In one or more embodiments, the samplers comprise analog-to-digital converters (ADCs), each ADC requiring M clock cycles to complete an analog-to-digital conversion. In one or more embodiments, the ADCs comprise N ADCs, M and N are integers greater than or equal to 2, and N is greater than M. In one or more embodiments, the samplers comprise track-and-hold circuits. In one or more embodiments, the samplers comprise sample-and-hold circuits.

Another aspect of the invention is directed to a time-interleaved sampling system comprising: an input signal having a time-varying analog value; and a plurality of samplers, each sampler operable in a track mode and a hold mode. In the track mode, the samplers track the analog value of the input signal. In the hold mode, each sampler holds a respective analog value of the input signal, the respective analog value comprising the analog value that a respective sampler tracked immediately before entering the hold mode. The samplers enter the track mode in a predetermined sequence. After each sampler is in the track mode for a predetermined time period, each sampler transitions to the hold mode. After a last sampler in the predetermined sequence enters the track mode, the predetermined sequence is repeated in a loop. In a first loop through the predetermined sequence: a first skipped sampler is bypassed from entering the track mode, and a first next sampler enters the track mode in place of the first skipped sampler, the first next sampler immediately following the first skipped sampler in the predetermined sequence. In a second loop through the predetermined sequence, the second loop occurring after the first loop: the first skipped sampler enters the track mode, after the first skipped sampler enters the track mode, a second skipped sampler is randomly selected to be bypassed from entering the track mode, and a second next sampler enters the track mode in place of the second skipped sampler, the second next sampler immediately following the second skipped sampler in the predetermined sequence.

In one or more embodiments, the second loop occurs immediately after the first loop. In one or more embodiments, the sampling system further comprises a random skip generation digital logic circuit having an output coupled to an input of the samplers, random skip generation digital logic circuit including encoded sampler skipping rules. In one or more embodiments, the random skip generation digital logic circuit includes a pseudo-random number generator having a pseudo-random number output that corresponds to the first and second skipped samplers.

In one or more embodiments, the samplers comprise analog-to-digital converters (ADCs), each ADC requiring M clock cycles to complete an analog-to-digital conversion. In one or more embodiments, the ADCs comprise N ADCs, M and N are integers greater than or equal to 2, and N is greater than M. In one or more embodiments, the encoded skipping rules include a first skipping rule that states that at least M+1 clock cycles must pass between when (a) the second skipped sampler enters the track mode in the first loop and (b) the second skipped sampler is bypassed from entering the track mode in the second loop.

In one or more embodiments, the samplers comprise track-and-hold circuits. In one or more embodiments, the samplers comprise sample-and-hold circuits.

Another aspect of the invention is directed to a method of time-interleaved sampling comprising: electrically coupling an input of a plurality of samplers to an input signal having a time-varying analog value, each sampler operable in a track mode and a hold mode, wherein: in the track mode, the samplers track the analog value of the input signal, and in the hold mode, each sampler holds a respective analog value of the input signal, the respective analog value comprising the analog value that a respective sampler tracked immediately before entering the hold mode. The method further comprises transitioning the samplers from hold mode to the track mode in a predetermined sequence; transitioning each sampler from the track mode to the hold mode after a predetermined time period; repeating the predetermined sequence in a loop after a last sampler in the predetermined sequence enters the track mode; and at random intervals, bypassing a skipped sampler from entering the track mode such that a next sampler enters the track mode in place of the skipped sampler, the next sampler immediately following the skipped sampler in the predetermined sequence.

In one or more embodiments, the skipped sampler is determined using one or more encoded sampler skipping rules. In one or more embodiments, the skipped sampler is a first skipped sampler and the next sampler is a first next sampler, and the method further comprises: in a first loop through the predetermined sequence, bypassing the first skipped sampler from entering the track mode such that the first next sampler enters the track mode in place of the first skipped sampler; and in a second loop through the predetermined sequence, the second loop occurring after the first loop: transitioning the first skipped sampler from the hold mode to the track mode such that the first skipped sampler is bypassed in the first loop but the first skipped sampler is not bypassed in the second loop; after the first skipped sampler transitions from the hold mode to the track mode, randomly selecting a second skipped sampler to bypass from entering the track mode such that a second next sampler enters the track mode in place of the second skipped sampler, the second next sampler immediately following the second skipped sampler in the predetermined sequence; and bypassing the second skipped sampler from entering the track mode. In one or more embodiments, the second loop occurs immediately after the first loop.

In one or more embodiments, the predetermined time period is a first predetermined time period and the samplers comprise N analog-to-digital converters (ADCs), each ADC requiring M clock cycles to complete an analog-to-digital conversion, and the method further comprises performing the analog-to-digital conversion with each ADC during a second predetermined time period that comprises M clock cycles, wherein M and N are integers greater than or equal to 2, and N is greater than M. In one or more embodiments, the method further comprises before randomly selecting the second skipped sampler to bypass from entering the track mode, determining that bypassing the second skipped sampler complies with an encoded sampler skipping rule. In one or more embodiments, the step of determining that bypassing the second skipped sampler complies with an encoded sampler skipping rule comprises determining that at least M+1 clock cycles have passed between (a) the second skipped sampler entering the track mode in the first loop and (b) the second skipped sampler being bypassed in the second loop.

BRIEF DESCRIPTION OF THE DRAWINGS

For a fuller understanding of the nature and advantages of the present concepts, reference is made to the detailed description of preferred embodiments and the accompanying drawings.

FIG. 4 illustrates an example of random skipping sequence.

DETAILED DESCRIPTION

A TI ADC circuit is configured to transition each ADC from a hold mode to a track mode in a predetermined sequence which repeats in a loop. The ADCs are randomly skipped or bypassed according to ADC skipping rules. When an ADC is skipped, the skipped ADC stays in the hold mode and does not transition to the track mode. The next ADC in the predetermined sequence transitions to the track mode in place of the skipped ADC. After an ADC enters the track mode, the ADC enters the hold mode to perform an analog-to-digital conversion (or otherwise process the analog value of the input signal).

The inventors have recognized that it is advantageous to provide randomization of sample sequences in a way the hardware implementation is more efficient than the prior art random selection. The inventors have also recognized that random skipping of samplers is more efficient in hardware implementation compared with random selection.

For example, random skipping provides significant benefits in simplicity of implementation of the overall architecture of the random sampling with mismatch error detection and correction of the corresponding TI ADC. The primary benefit of cyclical random skip is that a particular sampler always follows 1 of 2 other samplers rather than 1 of 7 possible samplers in an 8 sampler system. This allows for more efficient implementation and layout of both the sampler randomization circuits, but also the skew detection autocorrelation circuits, other mismatch detection and their correction circuits, and data output re-ordering circuits.

Though this description refers to TI ADCs, it is recognized that the invention can also be embodied using other time-interleaved sampler circuits, such as TI sample-and-hold circuits, TI track-and-hold circuits, and/or other time-interleaved sampler circuits.

Figure 1:
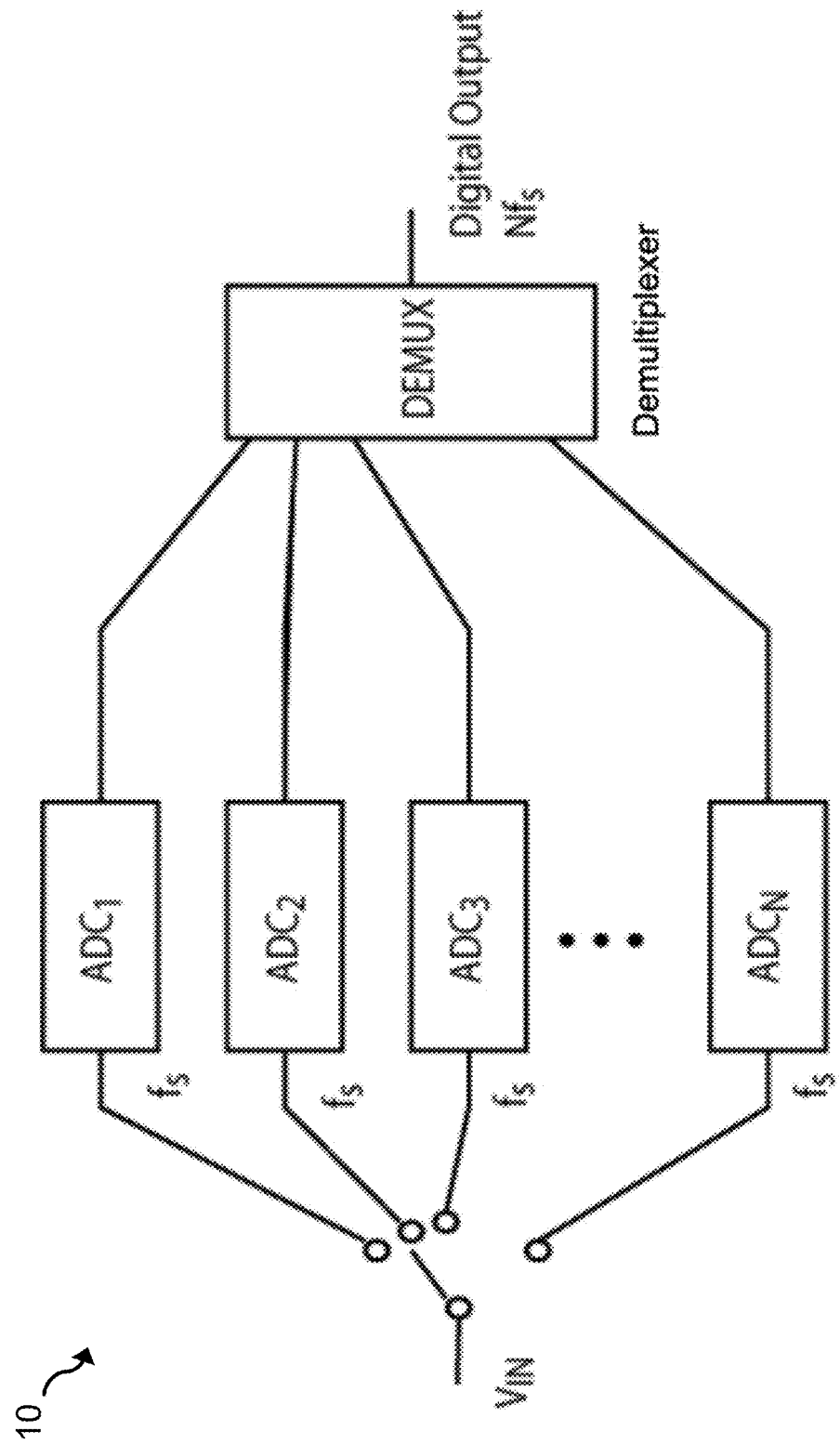
FIG. 1 is a schematic diagram of a time-interleaved analog-to-digital converter according to the prior art.
Figure 2:
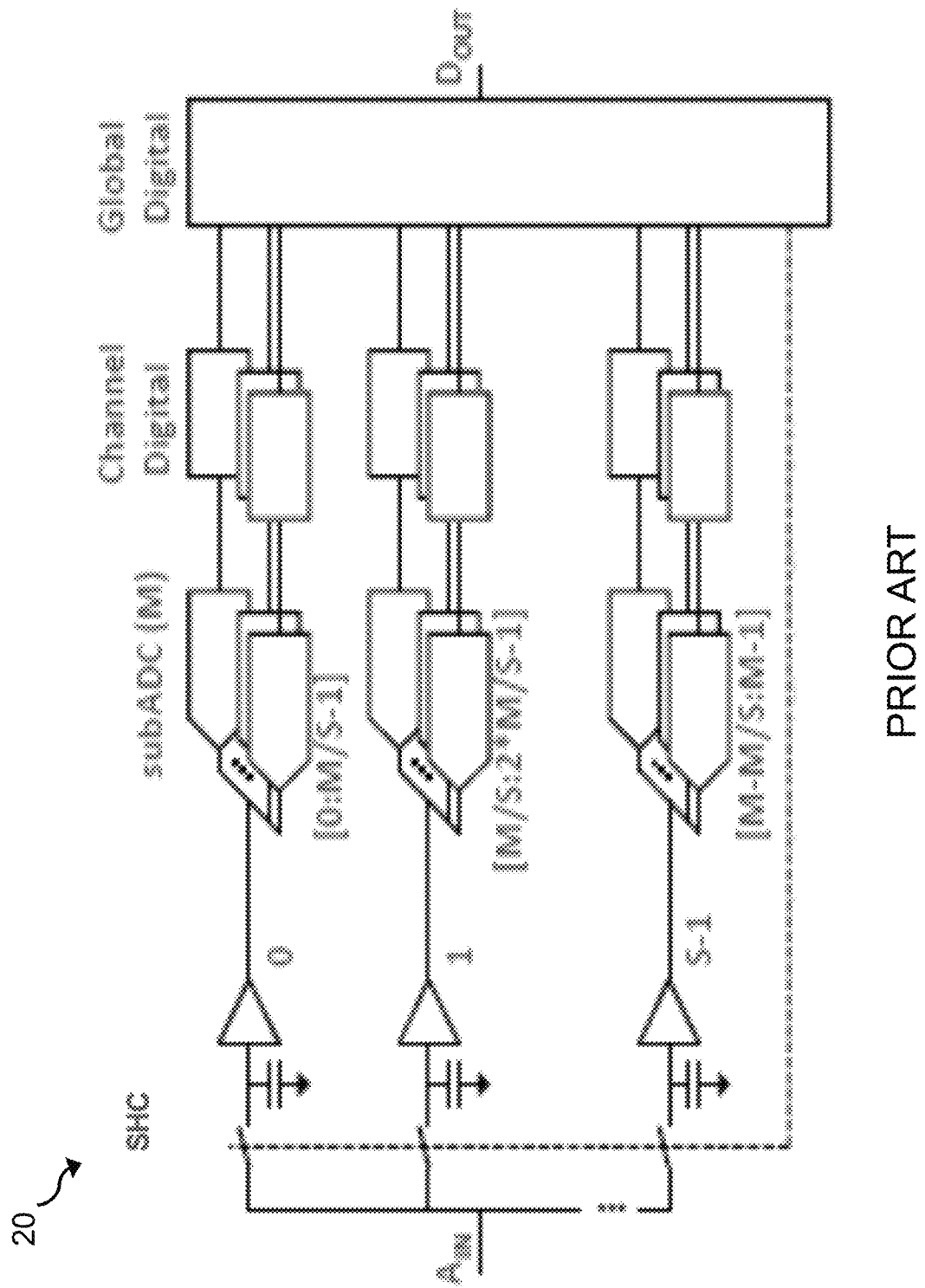
FIG. 2 is a hierarchical time interleaved analog-to-digital converter according to the prior art.
Figure 3:
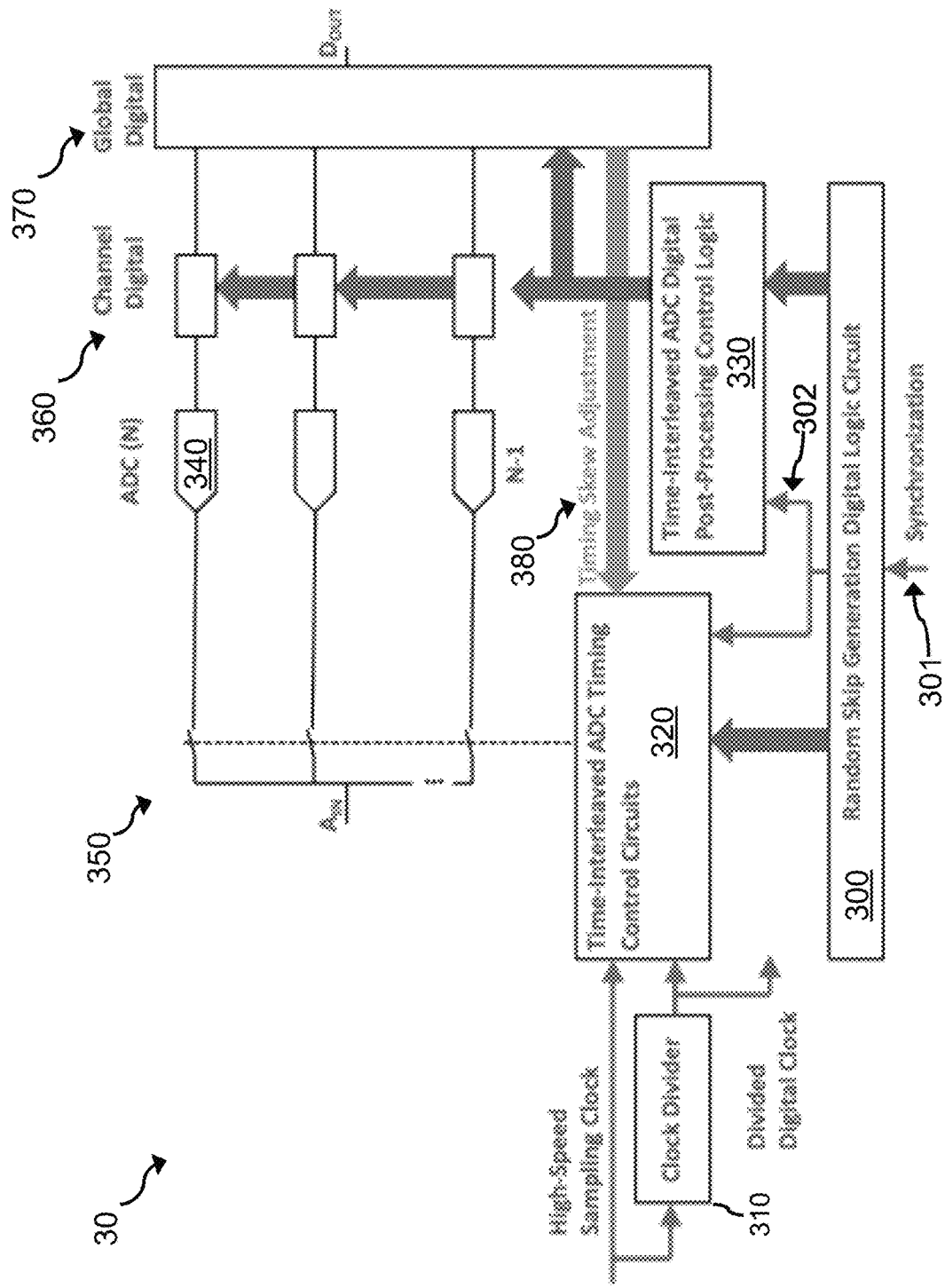
FIG. 3 is a schematic diagram of a TI ADC according to an embodiment.

FIG. 3 is a schematic diagram of a TI ADC 30 according to an embodiment. The TI ADC 30 includes a random skip generation digital logic circuit 300, a clock divider circuit 310, TI ADC timing control circuits 320, a TI ADC digital post-processing control circuit 330, a plurality of ADCs 340, and a plurality of switches 350. The clock divider circuit 310 divides a high-speed sampling clock such that all digital logic in TI ADC 30 is operated at a divided clock rate.

Each ADC 340 can be electrically coupled to an input signal $A_{IN}$ via a respective switch 350. When a switch 350 is in a closed state, the respective ADC 340 is electrically coupled to the input signal $A_{IN}$ to track the time-varying analog value (e.g., voltage and/or current) of the input signal $A_{IN}$. When the switch 350 is an opened state, the respective ADC 340 is electrically decoupled from the input signal $A_{IN}$ such that the ADC 340 holds the analog value that the ADC 340 tracked or sampled immediately before the switch 350 transitioned from the closed state to the open state. Thus, each ADC 340 is operable in either (a) a track mode where the ADC 340 tracks the time-varying analog value of the input signal $A_{IN}$ or (b) a hold or sample mode (in general, hold mode) where the ADC 340 holds the analog value that the ADC 340 tracked immediately before transitioning from the track mode to the hold mode.

During the hold mode, each ADC 340 performs an analog-to-digital conversion of the analog value of the input signal $A_{IN}$. Each ADC 340 needs a predetermined number of clock cycles M to perform the analog-to-digital conversion, and can transition back to the track mode after completing the analog-to-digital conversion (after M clock cycles such as at M+1 clock cycles).

The output of the TI ADC timing control circuits 320 includes output signals that selectively opens or closes each switch 350. The switches 350 are opened and closed such that the ADCs 340 enter the track mode in a predetermined sequence. For example, when there are N ADCs 340, the TI ADC timing control circuit 320 can output a first signal cause ADC 1 to enter the track mode on clock cycle 1, ADC 2 to enter the track mode on clock cycle 2 . . . and ADC N to enter the track mode on clock cycle N. After each ADC 340 is in the track mode for one clock cycle (or another predetermined time period), the TI ADC timing control circuit 320 can output a second signal that causes the respective ADCs 340 to enter the hold mode in the same order in which the ADCs 340 entered the track mode.

After the last ADC 340 in the predetermined sequence enters the track mode (e.g., ADC N), the TI ADC timing control circuit 320 can cause the predetermined sequence to be repeated in a loop (e.g., returning to ADC 1 to transition to the track mode). The loops through the predetermined sequence can repeat multiple times and/or indefinitely so long as power is provided to TI ADC 30 or processing is otherwise interrupted.

In a second loop through the predetermined sequence, the TI ADC timing control circuits 320 can output a third signal that causes the ADCs 340 to enter the track mode in the predetermined sequence. For example, the third signals can cause ADC 1 to enter the track mode on clock cycle M+1, ADC 2 to enter the track mode on clock cycle M+2 . . . and ADC N to enter the track mode on clock cycle M+N. The second loop can occur immediately after the first loop or in a subsequent or later loop through the predetermined sequence.

In some embodiments, the number M of clock cycles that each ADC 340 needs to perform an analog-to-digital conversion is less than the number N of ADCs 340 in TI ADC 30. As such, at the end of M clock cycles, there are N−M+1 ADCs 340 available (e.g., in the hold mode) to enter into in the track mode. For example, when each ADC 340 needs 7 clock cycles to perform an analog-to-digital conversion (i.e., M=7) and there are 8 ADCs (i.e., N=8), at the end of 7 clock cycles there are 2 ADCs 340 available to enter into the track mode. This is illustrated, for example, in Table 1 which illustrates the startup clock cycles of TI ADC 30.

At the start of clock cycle 0, all ADCs (0-7) are in hold mode and available to enter track mode. Next, ADC 0 enters track mode while ADCs 1-7 remain in hold mode through the end of clock cycle 0. At the start of clock cycle 1, ADCs 1-7 are in hold mode and available to enter track mode. Next, ADC 1 enters track mode while ADCs 2-7 remain in hold mode through the end of clock cycle 1. In addition, ADC 0 enters hold mode to perform an analog-to-digital conversion. At the start of clock cycle 2, ADCs 2-7 are in hold mode and available to enter track mode. Next, ADC 2 enters track mode while ADCs 3-7 remain in hold mode through the end of clock cycle 2. In addition, ADC 1 enters hold mode to perform an analog-to-digital conversion and ADC 0 continues to perform its analog-to-digital conversion. At the start of clock cycle 3, ADCs 3-7 are in hold mode and available to enter track mode. Next, ADC 3 enters track mode while ADCs 4-7 remain in hold mode through the end of clock cycle 3. In addition, ADC 2 enters hold mode to perform an analog-to-digital conversion and ADCs 0 and 1 continue to perform their analog-to-digital conversions. At the start of clock cycle 4, ADCs 4-7 are in hold mode and available to enter track mode. Next, ADC 4 enters track mode while ADCs 5-7 remain in hold mode through the end of clock cycle 4. In addition, ADC 3 enters hold mode to perform an analog-to-digital conversion and ADCs 0-2 continue to perform their analog-to-digital conversions. At the start of clock cycle 5, ADCs 5-7 are in hold mode and available to enter track mode. Next, ADC 5 enters track mode while ADCs 6-7 remain in hold mode through the end of clock cycle 5. In addition, ADC 4 enters hold mode to perform an analog-to-digital conversion and ADCs 0-3 continue to perform their analog-to-digital conversions. At the start of clock cycle 6, ADCs 6-7 are in hold mode and available to enter track mode. Next, ADC 6 enters track mode while ADC 7 remains in hold mode. In addition, ADC 5 enters hold mode to perform an analog-to-digital conversion and ADCs 0-4 continue to perform their analog-to-digital conversions. ADC 0 completes its analog-to-digital conversion at the end of clock cycle 6. At the start of clock cycle 7, ADCs 0 and 7 are in hold mode and available to enter track mode. Next, ADC 7 enters track mode while ADC 0 remains available in hold mode.

TABLE 1

| Clock cycle | Available ADCs (at start of clock cycle) | ADC Entering Track Mode (at start of clock cycle) | Available ADCs (at end of clock cycle) |
| --- | --- | --- | --- |
| 0 | 0-7 | 0 | 1-7 |
| 1 | 1-7 | 1 | 2-7 |
| 2 | 2-7 | 2 | 3-7 |
| 3 | 3-7 | 3 | 4-7 |
| 4 | 4-7 | 4 | 5-7 |
| 5 | 5-7 | 5 | 6-7 |
| 6 | 6-7 | 6 | 7 |
| 7 | 0,7 | 7 | 0 |

Returning to FIG. 3, the random skip generation digital logic circuit 300 has an output that is electrically coupled to an input of the TI ADC timing control circuits 320 and an input of the TI ADC digital post-processing control circuit 330. The output of the random skip generation digital logic circuit 300 includes an output signal that identifies or represents the ADC 340 to skip its turn in the predetermined sequence to enter the track state and the loop or cycle though the predetermined sequence to perform the skip. The random skip generation digital logic circuit 300 can include ADC skipping rules that can include logic to determine which ADC(s) can be skipped, when an ADC can be skipped, and/or other logic skipping rules. The TI ADC timing control circuits 320 adjust their output signals (e.g., that selectively opens or closes the switches 350) according to the output signal of the random skip generation digital logic circuit 300. In other words, the TI ADC timing control circuits 320 can cause a skip to occur by maintaining a first switch 350 in the open state to keep a corresponding first ADC 340 in the hold state at the clock cycle in the predetermined sequence at which that first switch 350 would ordinarily be closed to transition the first ADC 340 to the track state. For example, referring to Table 1, TI ADC timing control circuits 320 can cause ADC 6 to be skipped by maintaining corresponding switch 6 in the opened state at clock cycle 6, which is the clock cycle in the predetermined sequence at which switch 6 would ordinarily be closed to transition ADC 6 to the track state. Further, TI ADC timing control circuits 320 can cause ADC 6 to be skipped by closing switch 7, instead of closing switch 6, at clock cycle 6 such that ADC 7 transitions to the track state while ADC 6 stays in the hold state during clock cycle 6.

In one example, the ADC skipping rules can limit the number of ADCs that can be skipped in a single loop through the predetermined sequence. In one example, the ADC skipping rules can state that only 1 ADC can be skipped in a single loop through the predetermined sequence. In another example, the ADC skipping rules can state that only 1 or 2 ADCs can be skipped in a single loop through the predetermined sequence. In some embodiments, this can be defined as a relationship between M (the number of clock cycles an ADC needs to perform an analog-to-digital conversion) and N (the number of ADCs 340). For example, the ADC skipping rules can state M-N ADCs can be skipped in a single loop through the predetermined sequence. When M is 7 and N is 8 in the example above, this rule would state that only 1 ADC can be skipped in a single loop through the predetermined sequence. In another example, the ADC skipping rules can state M-N+1 ADCs can be skipped in a single loop through the predetermined sequence. When M is 7 and N is 8 in the example above, this rule would state that up to 2 ADCs can be skipped in a single loop through the predetermined sequence.

Additionally or alternatively, the ADC skipping rules can state that a predetermined minimum number of clock cycles must have passed since one ADC was skipped in order to skip another ADC. For example, when it takes M clock cycles to complete a loop through the predetermined sequence, the ADC skipping rules can state that at least M clock cycles must pass between skipping ADCs. In another example, the ADC skipping rules can state that at least M+1 clock cycles must pass between skipping ADCs.

Additionally or alternatively, the ADC skipping rules can state that a predetermined minimum number of clock cycles must have passed since an ADC was skipped in order to skip the same ADC again. For example, when it takes M clock cycles for an ADC to perform an analog-to-digital conversion, the ADC skipping rules can state that at least M clock cycles must pass after one ADC was skipped in order to skip the same ADC again. In another example, the ADC skipping rules can state that at least M+1 clock cycles must pass since one ADC was skipped in order to skip the same ADC again. In another example, the ADC skipping rules can state that at least N clock cycles must since one ADC was skipped in order to skip the same ADC again. This can effectively prevent the same ADC from being skipped twice in a row. Alternatively, the ADC skipping rules can simply state that the same ADC cannot be skipped twice in a row.

Figure 5:
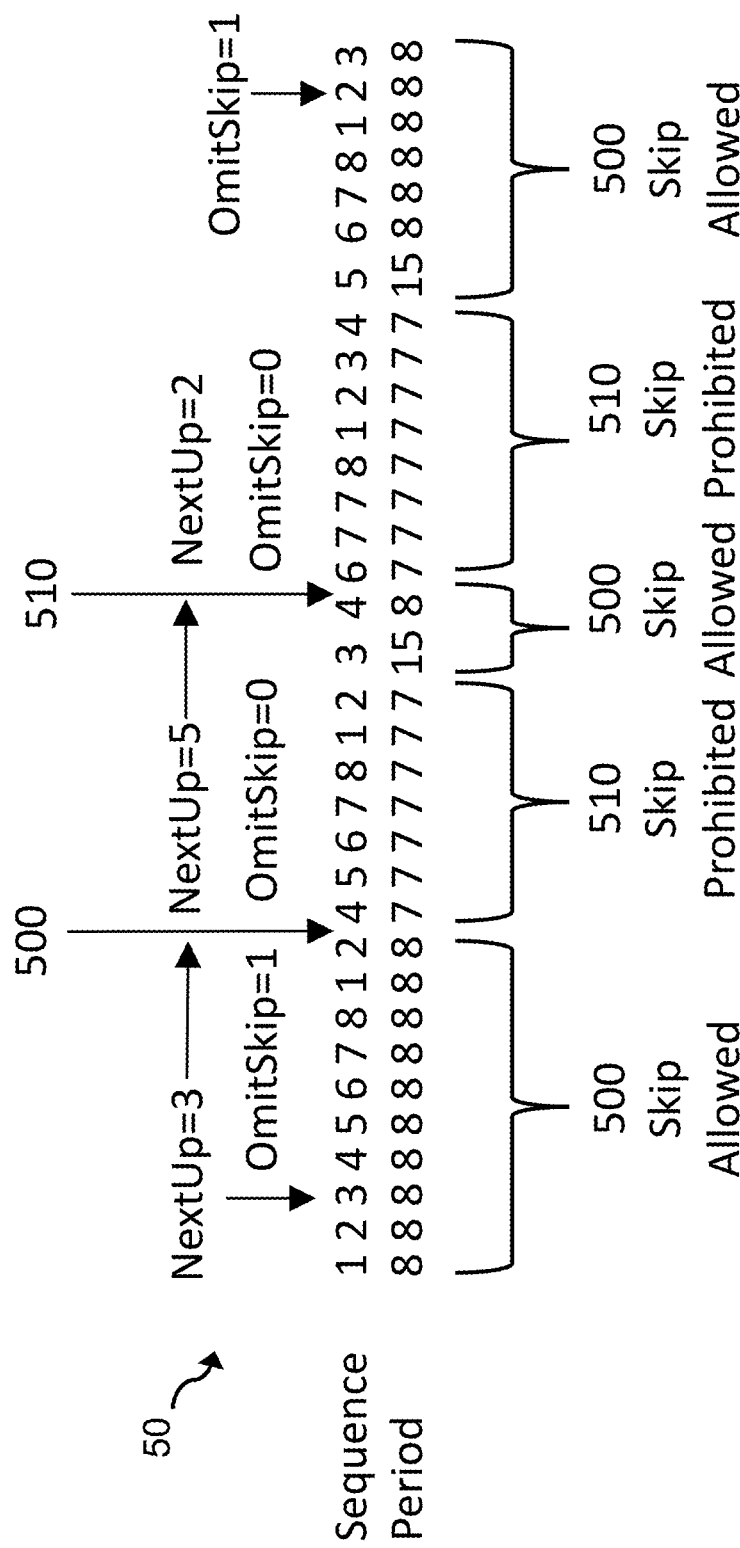
FIG. 5 illustrates another example of a random skipping sequence.

Additionally or alternatively, the ADC skipping rules can state that a predetermined minimum number of clock cycles must have passed since an ADC entered the track state in order to skip that ADC in a later clock cycle or loop. For example, when it takes M clock cycles for an ADC to perform an analog-to-digital conversion, the ADC skipping rules can state that at least M+1 clock cycles must pass after one ADC entered the track state in order to skip that ADC in a later clock cycle or loop. When M is 7 and N is 8 in the example above, this rule would state an ADC can only be skipped if it had entered the track state at least 8 clock cycles beforehand. This ADC skipping rule can prevent subsequent ADCs in the predetermined sequence from being placed in a new track state when they are not available because they have not completed the digital-to-analog conversions from an existing hold state. An example of this ADC skipping rule is illustrated in FIG. 5.

Additionally or alternatively, the ADC skipping rules can state that an ADC that is skipped in one loop cannot be skipped in the immediately-subsequent loop. The ADC skipping rules can further state that an ADC cannot be skipped in the immediately-subsequent loop until after the previously-skipped ADC (from the immediately-prior loop) has transitioned to the track state in the immediately-subsequent loop.

The sequence then proceeds in a cyclical manner until the previously-skipped sampler is selected. In that loop or in a subsequent or later loop, another sampler is randomly selected (e.g., using a pseudo random number generator) to be skipped when it comes up in the predetermined sequence. In some embodiments, the loop in which a sampler is skipped can be randomly selected (e.g., using a pseudo random number generator subject to the ADC skipping rules. Thus in some embodiments the samplers and the loops can be randomly selected subject to the ADC skipping rules.

When a plurality of ADCs in a loop through the predetermined sequence satisfy the ADC skipping rules such that those ADCs are eligible to skipped, the random skip generation digital logic circuit 300 can randomly or pseudo-randomly select one or more of the eligible ADCs to skip provided that the ADC skipping rules are maintained in the case of 2 or more ADC skips. For example, the random skip generation digital logic circuit 300 can use a pseudo-random number generator to determine which ADC(s) to skip.

An example of random skipping sequence is shown in table 40 in FIG. 4. Table 40 represents 4 cycles (0-3) through the predetermined sequence of 8 ADCs (0-7). Cycle 0 is the same as the example cycle illustrated above in Table 1. In cycle 1, a skip of ADC 1 occurs on clock cycle 9. In clock cycle 2, a skip of ADC 6 occurs on clock cycle 21. In clock cycle 3, a skip of ADC 0 occurs on clock cycle 30.

In practical implementations of high-speed time-interleaved ADCs, the digital post-processing circuits operate at a clock rate that is an integer division ratio with respect to the input sampling rate. For example, a 16 GSPS (gigasample per second) time-interleaved ADC can operate with digital post-processing circuits operating from a clock that is the input sampling clock frequency divided by 32, or 500 MHz. In this case, the digital data outputs are provided on a parallel data bus with 32 samples per digital clock cycle. For the following discussion, these multiple data values provided in a single digital clock cycles are referred to as a data frame. Table 40 is an example for a specific case of 8 samplers and clock divide ratio of 8. This results in a frame size of 8 data conversion results per digital output clock. Referring to table 40, the first column "Sample No./Clock cycle" represents the input sampling clock period beginning at time zero. The column "Frame/Cycle No." indicates the sequential frame in which the data output will appear. In this example, the frame number and the cycle number through the predetermined sequence are the same, and thus represented in the same column. Note that there will be latency associated with the data conversion and digital post-processing so that the output data is provided after multiple divided clock cycles. The column "Skip"' represents the randomly-generated skip information (0=no skip, 1=skip). The "ADC Entering Tracking Mode" column represents the index of the sampler/ADC that is activated in the sampling clock period (e.g., transitioned from track to hold). The "Available ADCs (at start of clock cycle)" column represents the index of the samplers/ADCs that are in the hold state and available to be transitioned to the track state at the start of the clock cycle before an ADC has been transitioned to the track state in that clock cycle. The "Available ADCs (at end of clock cycle)" column represents the index of the samplers/ADCs that are in the hold state and available to be transitioned to the track state at the end of the clock cycle after an ADC has been transitioned to the track state in that clock cycle.

After the random skip generation digital logic circuit 300 applies the ADC skipping rules and determines which ADC(s) to skip (if any), the random skip generation digital logic circuit 300 sends an output signal to TI ADC timing control circuits 320 and to TI ADC digital post-processing control circuit 330. The output signal represents the ADC(s) to skip and the loop(s) in which, to skip the ADC(s). The TI ADC timing control circuits 320 uses the information from the output signal of the random skip generation digital logic circuit 300 to selectively control the switches 350, as discussed above. The TI ADC digital post-processing control circuit 330 controls the digital post-processing logic circuits (e.g., channel digital 360 and global digital 370) to ensure that the data is processed and output is provided in the proper time sequence as ADC channels are skipped. The digital logic also controls the timing skew detection autocorrelation circuits in channel digital 360, which operate in conjunction with a Global Timing Skew Error Correction Controller within global digital 370, to ensure proper convergence of the timing skew correction loop. The timing skew correction signals 380 are provided to the timing skew adjustment circuits within the Time-Interleaved ADC Timing Control Circuits 320.

TI ADC 30 includes a means for synchronizing the sampler timing sequence (e.g., the output of TI ADC timing control circuits 320) and the TI ADC digital post-processing control logic 330. This can be implemented as a synchronization signal 301 provided to the random skip generation digital logic circuit 300, which subsequently provides synchronization signals 302 to both the sampler timing logic and digital post-processing controller blocks, each of which can include a synchronization circuit.

FIG. 5 illustrates another example of a random skipping sequence 50 according to an embodiment. The random skipping sequence 50 can be implemented using the ADC skipping rules in random skip generation digital logic circuit 300. Random skipping sequence 50 is implemented with 8 TI ADCs or samplers (N=8) each requiring 7 clock periods to complete its operation (M=7). N and/or M can be different in other embodiments. The top row (labeled "Sequence") represents the index of the sampler/ADC that is activated (e.g., transitioned to the hold state) on that clock cycle. The bottom row (labeled "Period") represents the number of clock cycles that have passed since the ADC index in the Sequence row has been activated. The ADC indexes are grouped into either skip allowed groups 500 or skip prohibited groups 510. In the skip allowed groups 500, each ADC index has a period of greater than or equal to 8 (i.e., N or M+1). In the skip prohibited groups 510, each ADC index has a period of 7 (i.e., M). Thus, in this example, the ADC skipping rules may state that at least M+1 clock cycles must pass after one ADC entered the track state in order to skip that ADC in a later clock cycle or loop.

In this embodiment, the random skipping sequence 50 progresses in a modulo-8 manner until the selected sampler is reached, where it is skipped (OmitSkip=0) and the next sampler in the predetermined sequence is selected. The sequence then proceeds in a cyclical manner until the previously-skipped sampler is selected. Immediately following, another sampler is randomly selected (e.g., using a pseudo random number generator) to be skipped when it comes up in the cyclical sequence.

Figure 6:
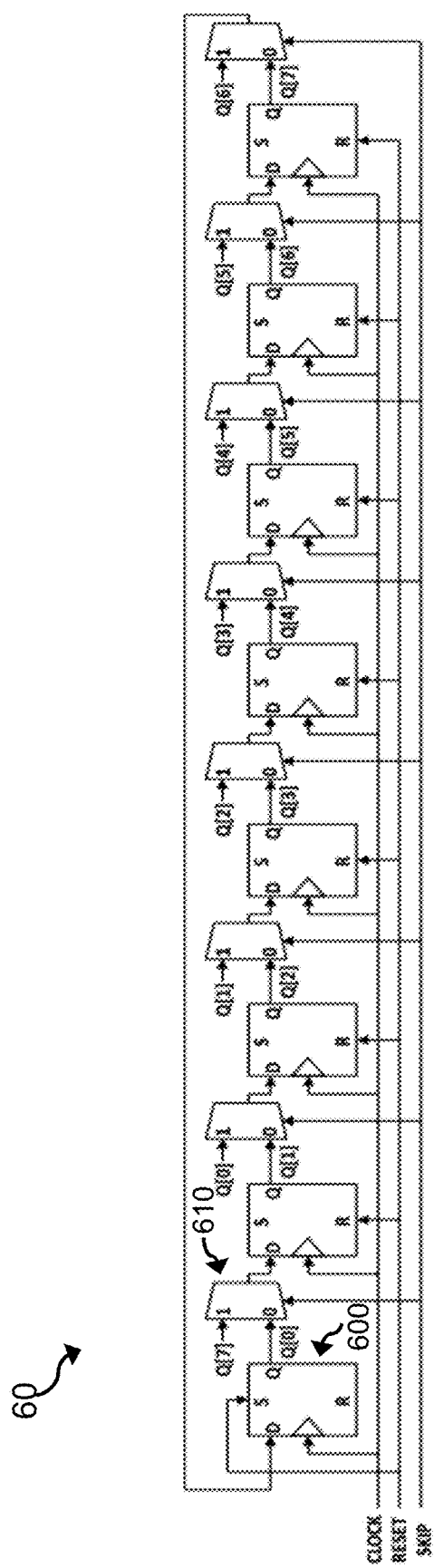
FIG. 6 is a schematic diagram of the TI ADC timing control circuits illustrated in FIG. 3.

FIG. 6 is a schematic diagram 60 of the circuits within TI ADC timing control circuits 320 that generate the sampler switch control signals. For example, in this embodiment TI ADC timing control circuits 320 comprise a ring counter with the addition of multiplexer (MUX) elements that allow for a skip signal. The ring counter can be reset to a known state, which allows for synchronization with a digital state tracking logic. The ring counter outputs select the active sampler. These sampler selection output signals are applied to additional timing circuits that create the required timing for the sampler circuits and the ADC circuits associated with the selected sampler. The functions in these additional timing circuits include re-timing to the high-speed input sampling clock, sampler timing skew adjustment, and pulse width adjustments to optimize signal tracking, sampler hold time, and sampler reset for both the high-speed sampler and ADC.

Figure 7:
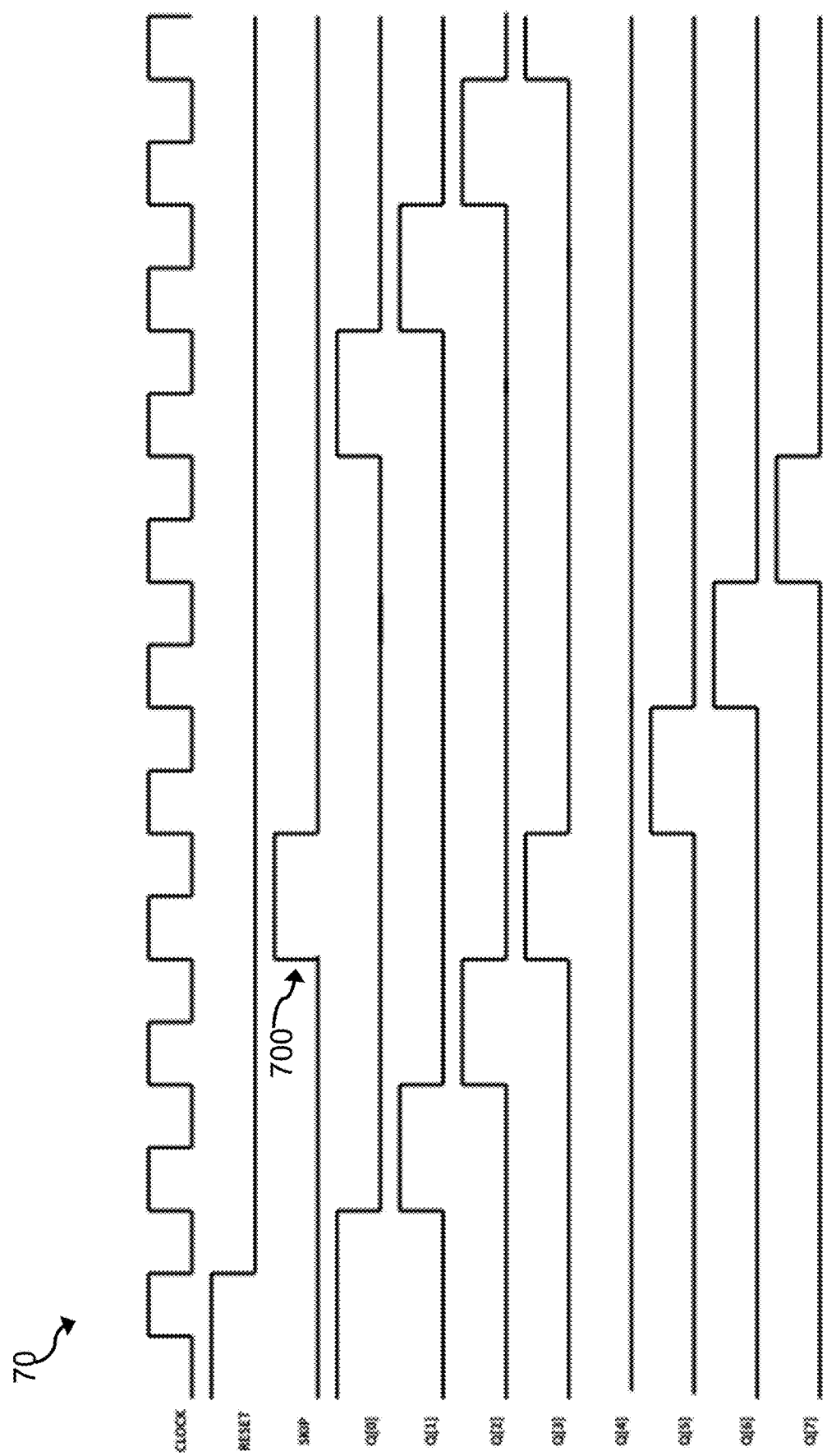
FIG. 7 illustrates example timing diagrams of various signals in the TI ADC timing control circuits illustrated in FIGS. 3 and 6.

FIG. 7 illustrates example timing diagrams 70 of various signals in TI ADC timing control circuits 60. For example, the timing diagrams 70 illustrate that a skip signal 700 is generated that causes switch 4 (e.g., for ADC 4) to remain closed to maintain ADC 4 in the track state instead of transitioning ADC 4 to the hold state.

Referring to FIGS. 6 and 7, the timing circuit 60 operation is initiated by application of a signal RESET, which sets output signal Q[0] high and outputs Q[1] through Q[7] low. The reset signal is then returned low and the outputs remain in this "reset" state until the next rising edge of CLOCK. At each CLOCK rising edge, the D input of each flip-flop element 600 is transferred to the Q output. Each D input signal is from a MUX 610 output. The MUX 610 acts as a switch that selects 1 of 2 inputs based on the control signal SKIP. At the first rising edge of CLOCK after RESET is low, the Q[0] signal is transferred to Q[1] since Q[0] is selected by the MUX 610 based on signal SKIP state low. Thus, immediately following this CLOCK rising edge, Q[1] is high and all other output signals Q[0], Q[2] through Q[7] are low. In a similar manner, immediately following the next rising CLOCK edge, Q[2] output is high and all other outputs are low. In the subsequent CLOCK period, Q[3] output is high and all other outputs are low. In the next CLOCK period, an input control signal SKIP is applied and on the subsequent CLOCK rising edge the Q[3] high signal is transferred to Q[5]. All other outputs, including Q[4] are low. Thus, the ADC sampling switch controlled by Q[4] is skipped in this clock cycle.

Figure 8:
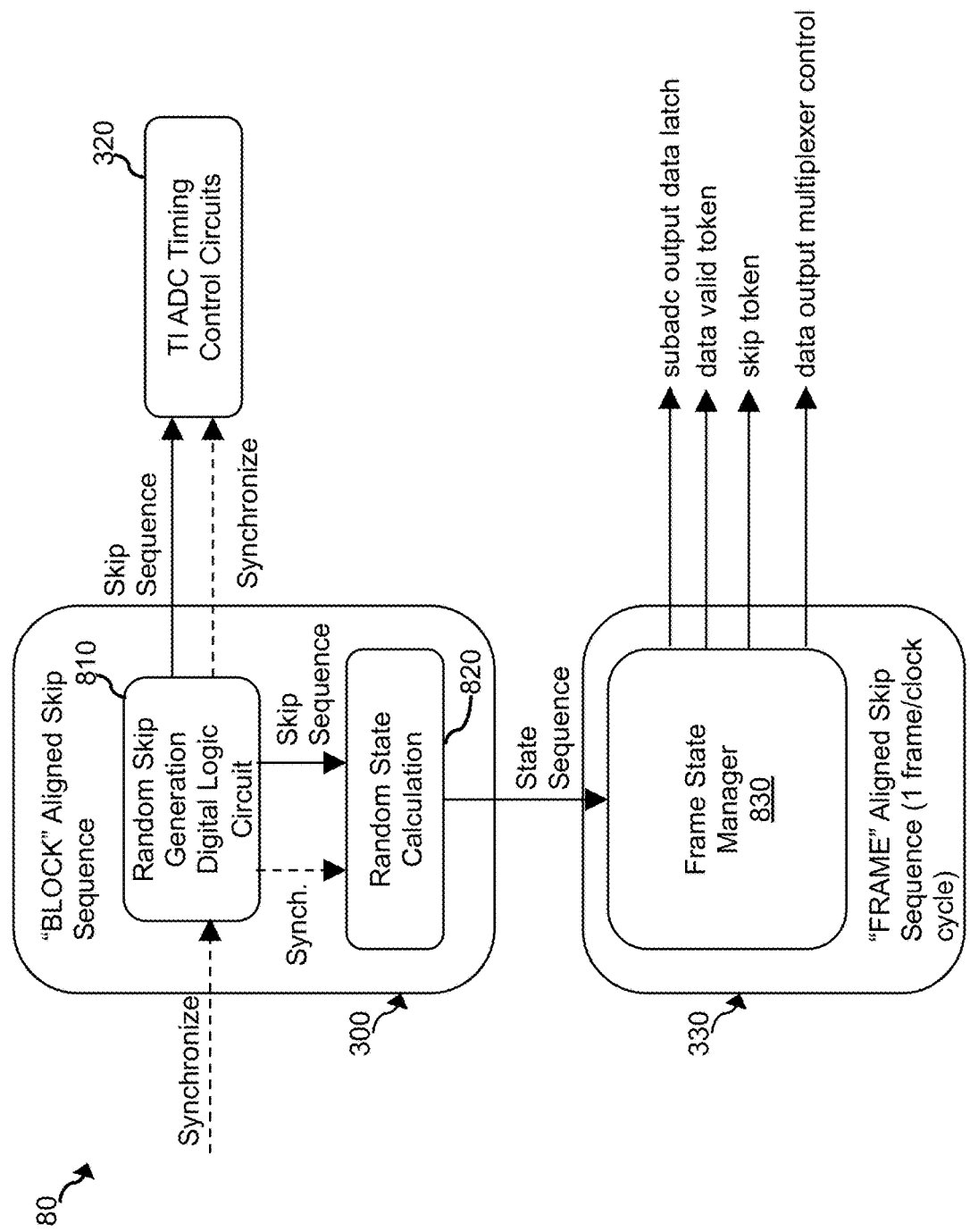
FIG. 8 is a high-level block diagram of a digital post-processing logic control circuit.

FIG. 8 is a high-level block diagram of a digital post-processing logic control circuit 80. Digital post-processing logic control circuit 80 can be the same as or can include random skip generation digital logic circuit 300 and TI ADC digital post-processing control circuit 330, discussed above.

Figure 9:
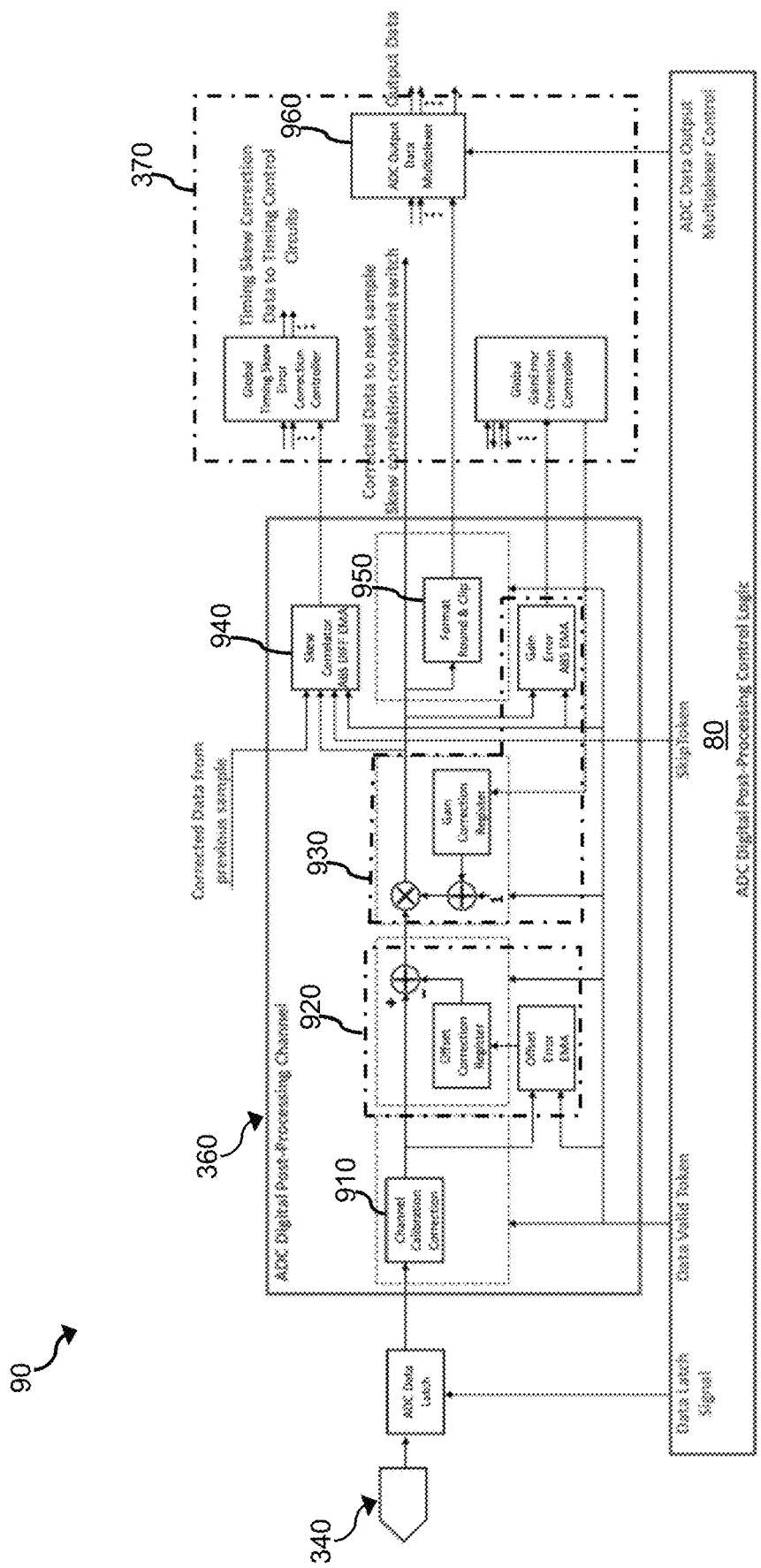
FIG. 9 is a block diagram of an ADC digital post-processing channel according to an embodiment.

FIG. 9 is a detailed block diagram 90 of certain components illustrated in TI ADC 30.

Random skip generation digital logic circuit 810 includes encoded ADC skipping rules and a pseudo random number generator. The output of random skip generation digital logic circuit 810 can comprise a single-bit sequence of numbers (e.g., a "skip sequence") where a logic "1" indicates that, for that sample in the sequence, a sampler circuit is skipped such that the next sampler is used for the data conversion. Since the digital logic is operating at a lower rate than the sample rate, the skip sequence can be created in blocks comprising skip information for multiple samples. The block size can be the same as the clock divide ratio or a 2N multiple of the clock divide ratio.

Each block of skip information is transmitted to the ADC timing control circuits 320 along with a synchronization signal. In practice, the skip information is relatively sparse and may be encoded or compressed. The same skip sequence information is also sent to random state calculation block 820 which includes a digital circuit that computes the conversion path (sampler/ADC index) for each sample. This conversion path is referred to as the "state" for the sample. Since the current state is a function of the skip information and previous states, it is necessary to synchronize the TI ADC timing control circuits 320 and the random state calculation block 820 with a synchronization signal that resets both blocks to a known initial condition. The output of the state calculation block is a state sequence with a length of 1 block that is precisely synchronized with the block of skip information that was sent to the TI ADC timing control circuits 320.

The state calculation block outputs (e.g., state sequence) are provided to a digital frame state manager block 830. Since the TI ADC timing control circuits 320 and the ADC conversion process introduce timing latency such that the ADC outputs are not time-aligned with the random state calculation block 820, one of the functions of the frame state manager block 830 is to convert the blocks of state information into properly time-aligned frames of state information. In order to optimize the timing, the state sequence in a frame may be from portions of 2 successive blocks of state sequence. The frame state sequence can be used to create several digital post-processing control signals: subadc output data latch, data valid token, skip token, and data output multiplexer control.

The subadc output data latch control signal can be used, for each digital clock cycle, to latch all ADC (or sub-ADC) outputs in the frame state sequence into the inputs of the channel digital signal paths. The channel digital path associated with each ADC implements all of the digital post-processing including ADC nonlinearity correction 910, offset error detection and correction 920, gain error detection and correction 930, timing skew detection 940, and clipping 950 (e.g., as illustrated in FIG. 9). These operations are pipelined over several digital clock cycles.

In addition to the data latching signal, the frame state manager 830 provides data valid and skip tokens to the channel inputs (e.g., as illustrated in FIG. 9). These tokens move through the pipeline in parallel with the data and control how the data is processed. The data valid token is a signal that indicates that the data in the channel is valid for the current clock cycle and should be processed (by adders and multipliers associated with nonlinearity correction, offset correction, etc.). The data valid token can be passed through the data processing pipeline and can act as a control signal to indicate if the processes in that stage of the pipeline should be executed for that particular clock cycle. By way of example if there are 32 sub-ADCs and frame size is 16, there will be 16 channels with data valid=1 and 16 channels with data valid=0. In contrast, the skip token indicates that the current data sample followed a skip and it is used to prevent the skew correlation exponential moving average (EMA) from updating. If the data valid token is true, the processing operations are completed, but if data valid token is false, the operations are omitted, which eliminates unnecessary arithmetic operations and ensures that each valid sample is applied to the processing operations only once. Processing operations can include some or all of the pipelined signal processing operations: nonlinearity correction, offset correction, gain mismatch correction, data formatting and clipping, as well as offset and gain error detection. The skip token is true only when a particular data valid sample is in a skip state, meaning that a sampler was skipped. When the skip token is true, the skew detection integrator update (e.g., in skew correlator 940) is omitted since the previous sample was not from the adjacent previous sampler. The timing skew detection operation implements a correlation function between successive data outputs, but only when the successive data outputs are from adjacent samplers. The output of the time-interleaved ADC is a bus of data values for each sample in the frame and sequentially ordered in accordance with the state sequence. A multiplexer 960 with inputs for each ADC channel and outputs for each sequential element of the frame can be used to multiplex the data values. The frame state manager provides corresponding data output multiplexer control inputs to control the multiplexer 960.

Figure 10:
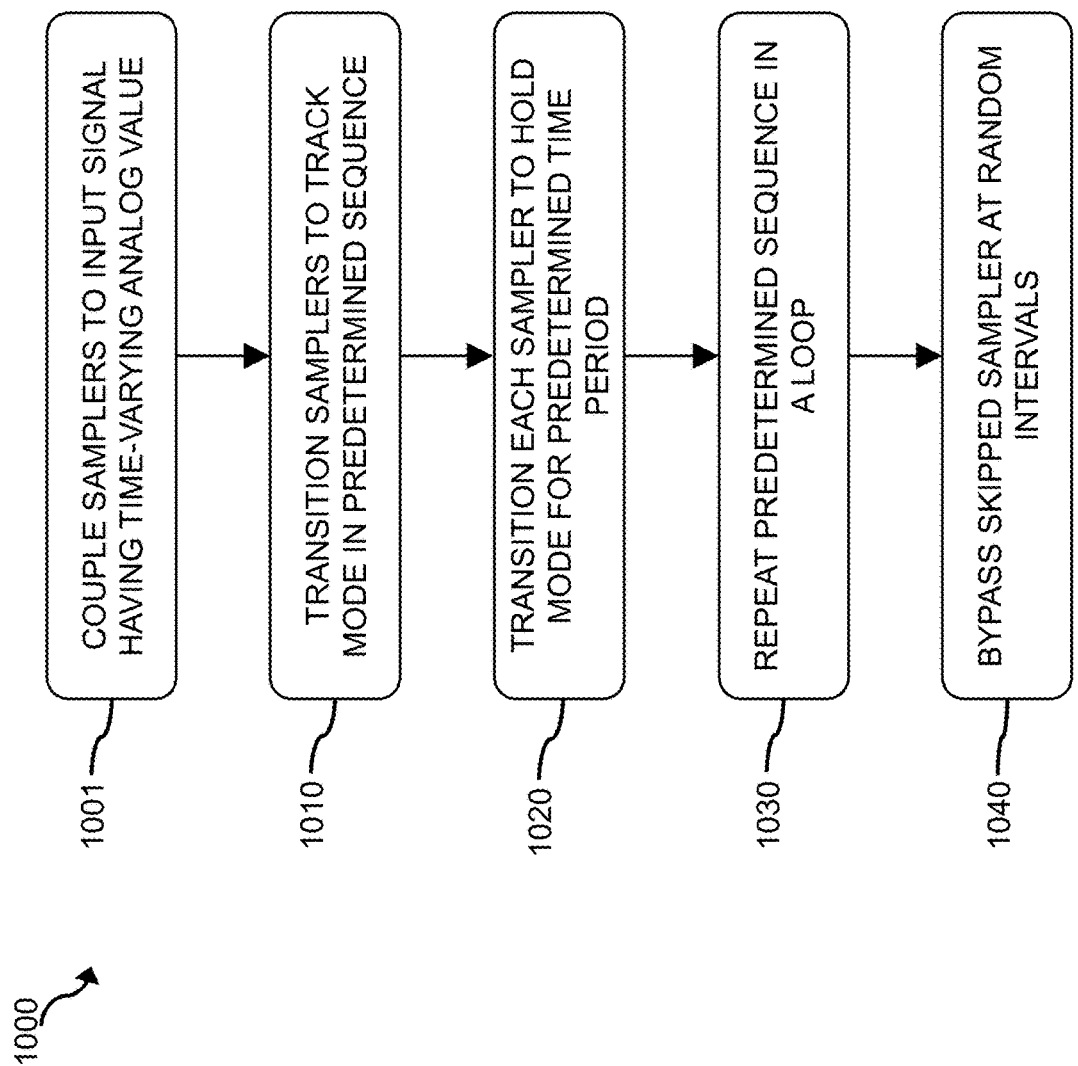
FIG. 10 is a flow chart of a method for time-interleaved sampling according to an embodiment.

FIG. 10 is a flow chart of a method 1000 for time-interleaved sampling according to an embodiment. In step 1001, an input of a plurality of samplers (e.g., N samplers) is electrically coupled to an input signal having a time-varying analog value. Each sampler is operable in a hold mode and in a track mode. In track mode, each sampler tracks the time-varying analog value of the input signal. In the hold mode, each sampler holds the respective analog value of the input signal that the respective sampler tracked immediately before entering the hold mode. In some embodiments, hold mode and track mode are the only operating states of the samplers. In some embodiments, the default mode of each sampler is the track mode. The samplers are preferably identical. Each sampler can comprise an ADC, a sample-and-hold circuit, a track-and-hold circuit, or another sampler circuit.

In step 1010, the samplers are selectively transitioned to the track mode in a predetermined sequence. For example, when there are N samplers, the predetermined sequence can comprise sampler 1, sampler 2, sampler 3 . . . sampler N−1, sampler N. Each sampler can be transitioned to the track mode on a respective clock cycle, and the clock cycles can immediately follow one another. For example, sampler 1 can enter the track mode on clock cycle 1 (or other arbitrary or relative clock cycle number), sampler 2 can enter the track mode on clock cycle 2, sampler 3 can enter the track mode on clock cycle 3 . . . sampler N−1 can enter the track mode on clock cycle N−1, and sampler N can enter the track mode on clock cycle N. Each sampler can stay in the track mode for one clock cycle or at least one clock cycle.

In step 1020, each sampler transitions from the track mode to the hold mode and remains in the hold mode for a predetermined time period (e.g., to process the analog value of the input signal). For example, each sampler can remain in the hold mode for M clock cycles, where M is equal to the number of clock cycles needed for the sampler to process the analog value of the input signal. In an ADC, processing the analog value of the input signal includes an analog-to-digital conversion of the analog value of the input signal. M is preferably less than N. For example, N can equal M+1, M+2, and/or M+X where X is an integer in the range of 1-5. M and N are positive integers (e.g., greater than or equal to 2). Each sampler is available to enter the track mode after the predetermined time period.

In step 1030, the predetermined sequence of the samplers entering track and hold modes (e.g., in steps 1010 and 1020) is repeated in a loop. The loop can repeat continuously and/or indefinitely.

In step 1040, at least one of the samplers is skipped at random intervals during the loops of the predetermined sequence. When a sampler is skipped, that sampler does not enter track mode on the clock cycle that it would ordinarily enter track mode. Instead, the next sampler that immediately follows the skipped sampler in the predetermined sequence enters track on that clock cycle. For example, when the predetermined sequence includes samplers 2 and 3, sampler 2 is skipped on clock cycle 2, and sampler 3 immediately follows sampler 2 in the predetermined sequence, then sampler 3 enters track mode on clock cycle 2 while sampler 2 remains in the hold mode. The predetermined sequence continues after one sampler is skipped until another sampler is skipped. Different sampler numbers or sampler indexes can be skipped on different loops through the predetermined sequence.

In some embodiments, one or more ADC skipping rules can be used to determine which sampler to skip and/or when (e.g., which clock cycle) to skip a sampler. Additional details regarding the ADC skipping rules are discussed herein. An example of an ADC skipping rule is that in order for a given sampler (e.g., sampler 1) to be skipped in a given loop through the predetermined sequence, (a) that sampler (e.g., sampler 1) must have transitioned to track mode in the immediately-preceding loop through the predetermined sequence and/or (b) at least M+1 clock cycles have passed between the clock cycle in the immediately-preceding loop in which the sampler (e.g., sampler 1) transitioned to track mode and the clock cycle in the given loop in which the sampler (e.g., sampler 1) is to be skipped.

The present invention should not be considered limited to the particular embodiments described above. Various modifications, equivalent processes, as well as numerous structures to which the present invention may be applicable, will be readily apparent to those skilled in the art to which the present invention is directed upon review of the present disclosure. The above-described embodiments may be implemented in numerous ways. One or more aspects and embodiments involving the performance of processes or methods may utilize program instructions executable by a device (e.g., a computer, a processor, or other device) to perform, or control performance of, the processes or methods.

In this respect, various inventive concepts may be embodied as a non-transitory computer readable storage medium (or multiple non-transitory computer readable storage media) (e.g., a computer memory of any suitable type including transitory or non-transitory digital storage units, circuit configurations in Field Programmable Gate Arrays or other semiconductor devices, or other tangible computer storage medium) encoded with one or more programs that, when executed on one or more computers or other processors, perform methods that implement one or more of the various embodiments described above. When implemented in software (e.g., as an app), the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more communication devices, which may be used to interconnect the computer to one or more other devices and/or systems, such as, for example, one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, a computer may have one or more input devices and/or one or more output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

The non-transitory computer readable medium or media may be transportable, such that the program or programs stored thereon may be loaded onto one or more different computers or other processors to implement various one or more of the aspects described above. In some embodiments, computer readable media may be non-transitory media.

The terms "program," "app," and "software" are used herein in a generic sense to refer to any type of computer code or set of computer-executable instructions that may be employed to program a computer or other processor to implement various aspects as described above. Additionally, it should be appreciated that, according to one aspect, one or more computer programs that when executed perform methods of the present application need not reside on a single computer or processor, but may be distributed in a modular fashion among a number of different computers or processors to implement various aspects of the present application.

Computer-executable instructions may be in many forms, such as program modules, executed by one or more computers or other devices. Generally, program modules include routines, programs, objects, components, data structures, etc. that performs particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Thus, the present disclosure and claims include new and novel improvements to existing methods and technologies, which were not previously known nor implemented to achieve the useful results described above. Users of the present method and system will reap tangible benefits from the functions now made possible on account of the specific modifications described herein causing the effects in the system and its outputs to its users. It is expected that significantly improved operations can be achieved upon implementation of the claimed invention, using the technical components recited herein.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:
1. A time-interleaved sampling system comprising;
an input signal having a time-varying analog value; and
a plurality of samplers, each sampler operable in a track mode and a hold mode;

wherein:
in the track mode, the samplers track the analog value of the input signal,
in the hold mode, each sampler holds a respective analog value of the input signal, the respective analog value comprising the analog value that a respective sampler tracked immediately before entering the hold mode,
the samplers enter the track mode in a predetermined sequence,
after each sampler is in the track mode for a predetermined time period, each sampler transitions to the hold mode,
after a last sampler in the predetermined sequence enters the track mode, the predetermined sequence is repeated in a loop, and
at random intervals, a skipped sampler in the predetermined sequence is bypassed from entering the track and hold modes.

2. The sampling system of claim 1, further comprising a random skip generation digital logic circuit having an output coupled to an input of the samplers.

3. The sampling system of claim 2, wherein the random skip generation digital logic circuit includes a pseudo-random number generator having a pseudo-random number output that corresponds to the skipped sampler.

4. The sampling system of claim 2, wherein the random skip generation digital logic circuit includes encoded sampler skipping rules.

5. The sampling system of claim 1, wherein the samplers comprise analog-to-digital converters (ADCs), each ADC requiring M clock cycles to complete an analog-to-digital conversion.

6. The sampling system of claim 5, wherein:
the ADCs comprise N ADCs,
M and N are integers greater than or equal to 2,
and N is greater than M.

7. The sampling system of claim 1, wherein the samplers comprise track-and-hold circuits.

8. The sampling system of claim 1, wherein the samplers comprise sample-and-hold circuits.

9. A time-interleaved sampling system comprising:
an input signal having a time-varying analog value; and
a plurality of samplers, each sampler operable in a track mode and a hold mode;
wherein:
in the track mode, the samplers track the analog value of the input signal,
in the hold mode, each sampler holds a respective analog value of the input signal, the respective analog value comprising the analog value that a respective sampler tracked immediately before entering the hold mode,
the samplers enter the track mode in a predetermined sequence,
after each sampler is in the track mode for a predetermined time period, each sampler transitions to the hold mode,
after a last sampler in the predetermined sequence enters the track mode, the predetermined sequence is repeated in a loop,
in a first loop through the predetermined sequence:
a first skipped sampler is bypassed from entering the track mode, and
a first next sampler enters the track mode in place of the first skipped sampler, the first next sampler immediately following the first skipped sampler in the predetermined sequence, and
in a second loop through the predetermined sequence, the second loop occurring after the first loop:
the first skipped sampler enters the track mode,
after the first skipped sampler enters the track mode, a second skipped sampler is randomly selected to be bypassed from entering the track mode, and
a second next sampler enters the track mode in place of the second skipped sampler, the second next sampler immediately following the second skipped sampler in the predetermined sequence.

10. The sampling system of claim 9, wherein the second loop occurs immediately after the first loop.

11. The sampling system of claim 9, further comprising a random skip generation digital logic circuit having an output coupled to an input of the samplers, random skip generation digital logic circuit including encoded sampler skipping rules.

12. The sampling system of claim 11, wherein the random skip generation digital logic circuit includes a pseudo-random number generator having a pseudo-random number output that corresponds to the first and second skipped samplers.

13. The sampling system of claim 11, wherein the samplers comprise analog-to-digital converters (ADCs), each ADC requiring M clock cycles to complete an analog-to-digital conversion.

14. The sampling system of claim 13, wherein:
the ADCs comprise N ADCs,
M and N are integers greater than or equal to 2,
and N is greater than M.

15. The sampling system of claim 13, wherein the encoded skipping rules include a first skipping rule that states that at least M+1 clock cycles must pass between when (a) the second skipped sampler enters the track mode in the first loop and (b) the second skipped sampler is bypassed from entering the track mode in the second loop.

16. The sampling system of claim 9, wherein the samplers comprise track-and-hold circuits.

17. The sampling system of claim 9, wherein the samplers comprise sample-and-hold circuits.

18. A method of time-interleaved sampling comprising:
electrically coupling an input of a plurality of samplers to an input signal having a time-varying analog value, each sampler operable in a track mode and a hold mode, wherein:
in the track mode, the samplers track the analog value of the input signal, and
in the hold mode, each sampler holds a respective analog value of the input signal, the respective analog value comprising the analog value that a respective sampler tracked immediately before entering the hold mode;
transitioning the samplers from hold mode to the track mode in a predetermined sequence;
transitioning each sampler from the track mode to the hold mode after a predetermined time period;
repeating the predetermined sequence in a loop after a last sampler in the predetermined sequence enters the track mode; and
at random intervals, bypassing a skipped sampler from entering the track mode such that a next sampler enters the track mode in place of the skipped sampler, the next sampler immediately following the skipped sampler in the predetermined sequence.

19. The method of claim 18, wherein the skipped sampler is determined using one or more encoded sampler skipping rules.

20. The method of claim 18, wherein the skipped sampler is a first skipped sampler and the next sampler is a first next sampler, and the method further comprises:
in a first loop through the predetermined sequence, bypassing the first skipped sampler from entering the track mode such that the first next sampler enters the track mode in place of the first skipped sampler; and
in a second loop through the predetermined sequence, the second loop occurring after the first loop:
transitioning the first skipped sampler from the hold mode to the track mode such that the first skipped sampler is bypassed in the first loop but the first skipped sampler is not bypassed in the second loop;
after the first skipped sampler transitions from the hold mode to the track mode, randomly selecting a second skipped sampler to bypass from entering the track mode such that a second next sampler enters the track mode in place of the second skipped sampler, the second next sampler immediately following the second skipped sampler in the predetermined sequence; and
bypassing the second skipped sampler from entering the track mode.

21. The method of claim 20, wherein the second loop occurs immediately after the first loop.

22. The method of claim 20, wherein the predetermined time period is a first predetermined time period and the samplers comprise N analog-to-digital converters (ADCs), each ADC requiring M clock cycles to complete an analog-to-digital conversion, and the method further comprises performing the analog-to-digital conversion with each ADC during a second predetermined time period that comprises M clock cycles, wherein M and N are integers greater than or equal to 2, and N is greater than M.

23. The method of claim 22, further comprising before randomly selecting the second skipped sampler to bypass from entering the track mode, determining that bypassing the second skipped sampler complies with an encoded sampler skipping rule.

24. The method of claim 23, wherein the step of determining that bypassing the second skipped sampler complies with an encoded sampler skipping rule comprises determining that at least M+1 clock cycles have passed between (a) the second skipped sampler entering the track mode in the first loop and (b) the second skipped sampler being bypassed in the second loop.

* * * * *